United States Patent
Jiang et al.

(10) Patent No.: US 9,508,783 B2
(45) Date of Patent: Nov. 29, 2016

(54) DISPLAY PANEL AND FABRICATION METHOD THEREOF

(71) Applicants: Shanghai Tianma Microelectronics Co., Ltd., Shanghai (CN); Tianma Microelectronics Co., Ltd., Shenzhen (CN)

(72) Inventors: Wenxin Jiang, Shanghai (CN); Yong Wu, Shanghai (CN); Zhengzhong Chen, Shanghai (CN)

(73) Assignees: SHANGHAI TIANMA MICROELECTRONICS CO., LTD., Shanghai (CN); TIANMA MICROELECTRONICS CO., LTD., Shenzhen (CN)

(*) Notice: Subject to any disclaimer, the term of this patent is extended or adjusted under 35 U.S.C. 154(b) by 0 days.

(21) Appl. No.: 14/742,588

(22) Filed: Jun. 17, 2015

(65) Prior Publication Data
US 2016/0284781 A1    Sep. 29, 2016

(30) Foreign Application Priority Data

Mar. 27, 2015  (CN) .......................... 2015 1 0141569

(51) Int. Cl.
| | |
|---|---|
| *H01L 33/56* | (2010.01) |
| *H01L 33/12* | (2010.01) |
| *H01L 27/32* | (2006.01) |
| *H01L 51/56* | (2006.01) |
| *H01L 51/52* | (2006.01) |

(52) U.S. Cl.
CPC ......... *H01L 27/3276* (2013.01); *H01L 51/529* (2013.01); *H01L 51/5253* (2013.01); *H01L 51/56* (2013.01); *H01L 2227/323* (2013.01); *H01L 2227/326* (2013.01); *H01L 2251/566* (2013.01)

(58) Field of Classification Search
CPC .......... H01L 27/3276; H01L 51/0097; H01L 51/56; H01L 2227/326; H01L 2227/00; H01L 25/075; H01L 27/115; H01L 33/08
See application file for complete search history.

(56) References Cited

U.S. PATENT DOCUMENTS

| | | | |
|---|---|---|---|
| 8,178,878 B2 | 5/2012 | Chien et al. | |
| 8,858,286 B2 | 10/2014 | Lee et al. | |
| 2012/0026449 A1* | 2/2012 | Yang | ..................... G02F 1/1339 349/153 |
| 2015/0014635 A1 | 1/2015 | Noh | |
| 2015/0034935 A1 | 2/2015 | Choi | |
| 2015/0048329 A1 | 2/2015 | Kim | |
| 2015/0311409 A1* | 10/2015 | Huang | .................. G02F 1/1362 257/99 |

FOREIGN PATENT DOCUMENTS

CN           101276083 A     10/2008

* cited by examiner

*Primary Examiner* — Thomas L Dickey
*Assistant Examiner* — Damon Hillman
(74) *Attorney, Agent, or Firm* — Anova Law Group, PLLC

(57) ABSTRACT

A display panel and fabrication method is provided. The display panel may include a substrate, and the substrate includes a display region and a border region surrounding the display region. The display panel also include a heat transfer pattern formed in the border region of the substrate to transfer and dissipate heat generated during a laser cutting process when forming the display panel. The heat transfer pattern includes at least one metal layer.

14 Claims, 9 Drawing Sheets

US 9,508,783 B2

DISPLAY PANEL AND FABRICATION METHOD THEREOF

CROSS-REFERENCES TO RELATED APPLICATIONS

This application claims the priority of Chinese patent application No. CN201510141569.4, filed on Mar. 27, 2015, the entire content of which is incorporated herein by reference.

FIELD OF THE DISCLOSURE

The present disclosure relates to the field of flat panel display technology and, more particularly, relates to a display panel and related fabrication techniques.

BACKGROUND

In recent years, with the technical development in personal smart terminal equipment and wearable devices, demands on flat panel displays become more and more diversified, such as Organic Light Emitting Diode (OLED) displays, OLED flexible displays, electrophoretic displays, liquid crystal displays, etc. Among them, flexible displays hold various advantages, such as thinner, less power consumption, bendable and more flexible, and thus are widely used.

The process for fabricating flexible display panels includes forming a plurality of flexile display panels on a mother substrate and cutting the mother substrate to form individual flexible display panels. The substrate used in the flexible display panel may often be made of resin or similar material, and the cutting process may be a laser cutting process.

However, resin has a large thermal expansion coefficient. During the laser cutting process, edges of the flexible display panel may absorb a large amount of heat and undergo a large thermal expansion, causing damage to peripheral components outside the flexible display panel's display region, and damage to the OLED packaging in the display region. As a result, abnormal display may appear on edge regions of the fixable display panel from the laser cutting process. The disclosure is directed to solve one or more problems set forth above and other problems.

BRIEF SUMMARY OF THE DISCLOSURE

One aspect of the present disclosure provides a display panel fabrication method. The fabrication method includes providing a base substrate and forming a mother substrate on the base substrate. The mother substrate includes a display panel region for subsequently forming a plurality of display panels and a peripheral region surrounding the display panel region. The fabrication method also includes forming thin film transistor (TFT) arrays and heat transfer patterns on the mother substrate, where heat transfer patterns include a heat transfer pattern formed in a border region of each of the plurality of display panels. Further, the fabrication method includes cutting the mother substrate to separate the plurality of display panels along a cutting path according to the heat transfer pattern of each of the plurality of display panels so as to transfer and dissipate heat generated during cutting the mother substrate, and packaging the individually separated display panels.

Another aspect of the present disclosure provides a display panel. The display panel may include a substrate, and the substrate includes a display region and a border region surrounding the display region. The display panel also include a heat transfer pattern formed in the border region of the substrate to transfer and dissipate heat generated during a laser cutting process when forming the display panel. The heat transfer pattern includes at least one metal layer.

Another aspect of the present disclosure a mother substrate of a plurality of display panels. The mother substrate includes a display panel region containing the plurality of display panels, and a peripheral region surrounding the display panel region. The mother substrate also includes heat transfer patterns formed in the display panel according to the plurality of display panels, and the heat transfer patterns includes a heat transfer pattern formed in a border region of each of the plurality of display panels. Each individual display panel includes a substrate containing a display region and a border region surrounding the display region; and the heat transfer pattern is formed in the border region to transfer and dissipate heat generated during a cutting process for cutting the individual display panel from the mother substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

Figure 1:
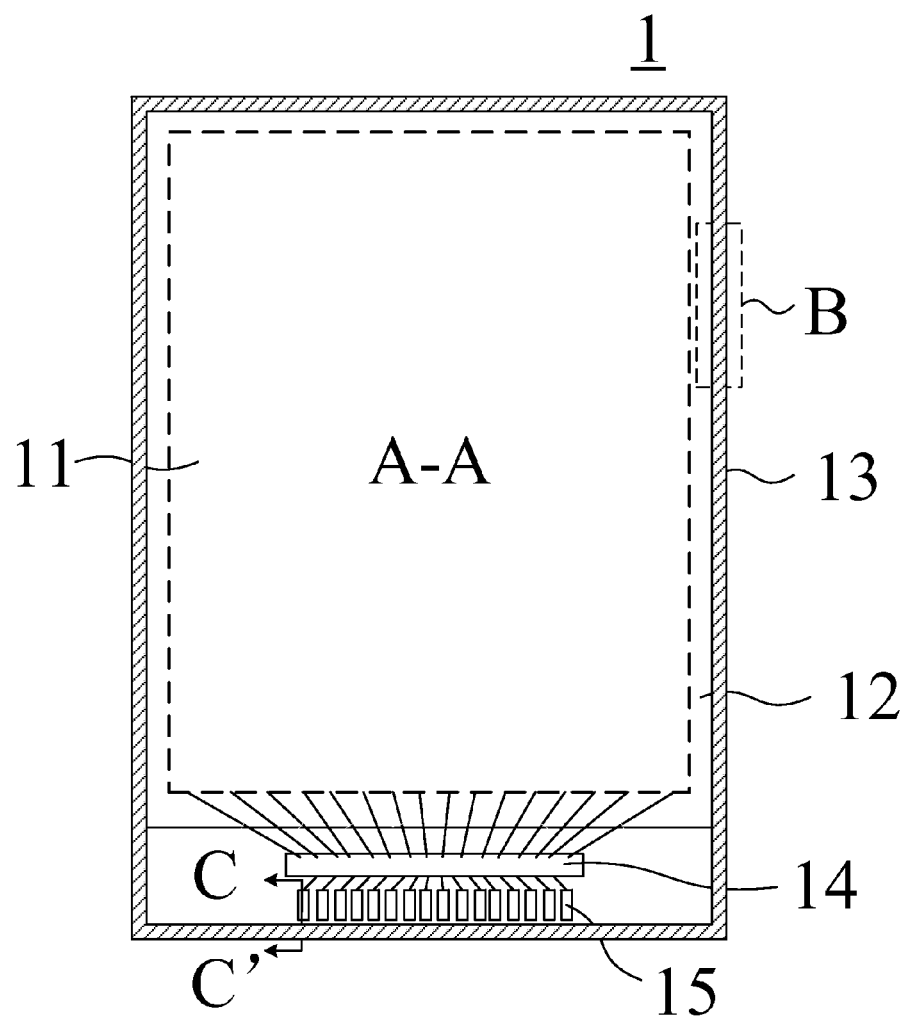
FIG. 1 illustrates an exemplary display panel consistent with disclosed embodiments.
Figure 2:
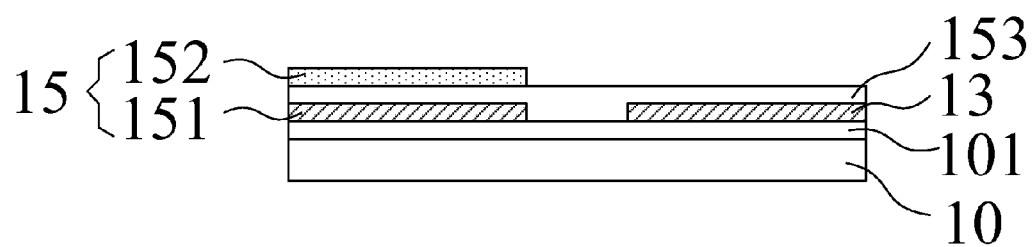
FIG. 2 illustrates a C-C' sectional view of an exemplary heat transfer pattern in FIG. 1 consistent with disclosed embodiments.

FIG. 1 illustrates an exemplary display panel consistent with the disclosed embodiments. FIG. 2 illustrates the C-C' sectional view of an exemplary heat transfer pattern in FIG. 1 consistent with the disclosed embodiments.

As shown in FIG. 1, the display panel 1 may include a substrate. The substrate may be a flexible substrate. The substrate may further include an A-A display region 11 and a border region 12 surrounding the A-A display region 11. A heat transfer pattern 13 may be formed in the border region 12 on the substrate. Further, one or more driving chips 14 and signal transmission terminals 15 may be formed in the border region 12 on the display panel 1. The signal transmission terminals 15 may be located on the inner side of the heat transfer pattern 13, on the far side from the edge of the substrate. The driving chips 14 may be electrically connected to the signal transmission terminals 15 and may also be electrically connected to the pixel units in the display region 11 to supply display signals.

Figure 13:
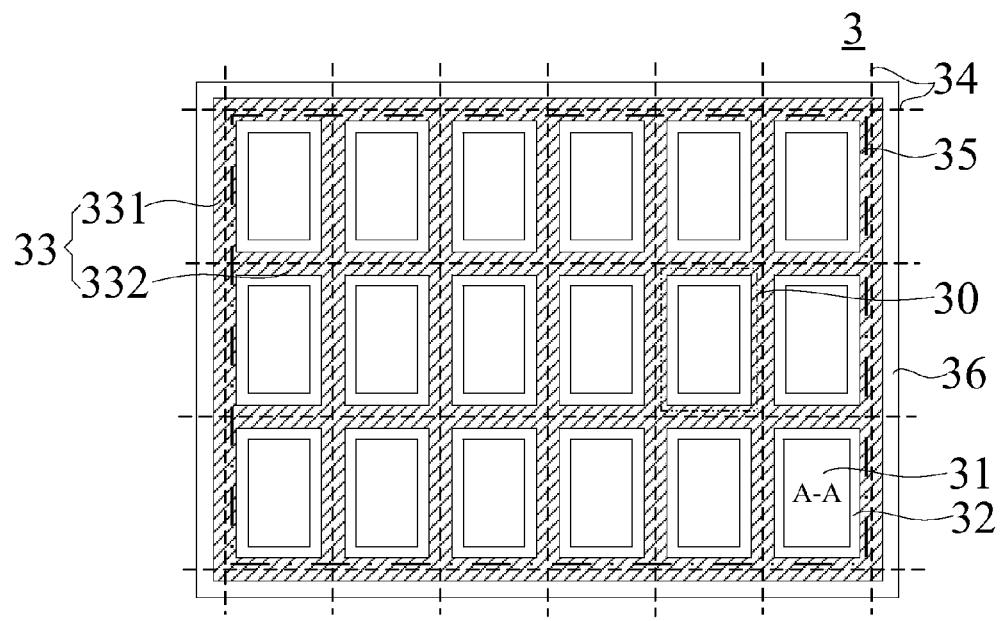
FIG. 13 illustrates a schematic of an exemplary mother substrate consistent with disclosed embodiments.

During the fabrication process of the display panel 1, a mother substrate may be used to manufacture a plurality of display panels in a batch, as shown in FIG. 13. After the plurality of display panels are fabricated on the mother substrate, a laser cutting process may be used to cut the individual display panels 1 from the mother substrate. FIG. 15 shows an exemplary fabrication process consistent with the disclosed embodiments.

As shown in FIG. 15, at the beginning of the fabrication process, a glass substrate is provided (S01). Further, a flexible substrate may be formed on the glass substrate (S02). More specifically, the flexible substrate may be made of polyimide (PI) using a coating process. The flexible substrate may also be made of other appropriate materials such as polyester (PET) and polyethylenenaphthalate (PEN). The flexible substrate may serve as a mother substrate to form a plurality of display panels. The glass substrate may serve as a base substrate, and other material substrate may also be used.

Further, thin film transistor (TFT) arrays and heat transfer patterns may be formed on the flexible substrate (S03). The TFT arrays may include source/drain regions, gate regions, source/drain electrodes, gate electrodes, interconnection structures, etc. The TFT arrays may be formed using a plurality of processes including ion implantation, photolithography, etching, deposition, etc.

The heat transfer patterns may be made of one or more metal materials and may be formed together with the TFT arrays, i.e., without additional processes. For example, the heat transfer patterns may be formed as the same layer as the gate electrode layer or the source/drain electrode layer. By forming the TFT arrays and the heat transfer patterns together in same processes, manufacturing cost of the display panels may be kept at a low level.

The heat transfer patterns may be used to transfer and dissipate the heat generated during a subsequent laser cutting process when the flexible mother substrate is cut to form the individual display panels. The heat transfer patterns may use various configurations as illustrated below in details. By using the heat transfer patterns, thermal expansion during the laser cutting process may be reduced and the display panel fabrication yield may be improved.

Further, still referring to FIG. 15, an OLED layer may be formed on the TFT (S04). More specifically, electroluminescent materials may be deposited on the substrate to form the OLED layer. The OLED layer may or may not cover the heat transfer patterns. Further, the OLED layer may be packaged using a thin film encapsulation (TFE) (S05). The TFE encapsulation may protect the OLED layer from being contaminated by environmental moisture and oxygen, improving the performance of the display panels. The TFE layer may be transparent.

Further, a protective layer may be formed on the TFE layer (S06). The protective layer may protect the TFE layer from physical damages such as scratching. The flexible substrate may then be separated from the glass substrate (S07). More specifically, after forming the protective layer, the flexible substrate may be separated from the rigid glass substrate to make the display panel become flexible.

Further, a protective layer may be formed on the backside of the flexible substrate (S08). The protective layer may protect the flexible substrate from physical and chemical damages. A laser cutting process may be used to cut the flexible substrate along the heat transfer patterns to form individual display panels (S09). Because a plurality of display panels may be formed together on the mother substrate. The mother substrate may need to be cut to form individual display panels. More specifically, the mother substrate may be cut along the heat transfer patterns such that the heat generated by the laser cutting process may be transferred and dissipated by the heat transfer patterns. Thus, thermal expansion may be avoided and the production yield may be improved.

Afterwards, a wire bonding process may be performed to bond integrated circuits (IC) to flexible printed circuits (FPC) (S10). More specifically, after forming individual display panels, the peripheral IC may be electrically connected to the FPC on the flexile substrate. In other words, the display panels are individually packaged, and the flexible OLED display panels may be formed (S11).

With respect to an individual display panel as shown in FIG. 1, FIG. 2 illustrates the C-C' sectional view of an exemplary heat transfer pattern in FIG. 1 consistent with the disclosed embodiments.

As shown in FIG. 2, an insulation layer 101 may be formed on the substrate 10. The heat transfer pattern 13 may be formed in the border region 12 on the insulation layer 101. The heat transfer pattern 13 may extend along the edge of at least a portion of the substrate 10. In an embodiment, the heat transfer pattern 13 may extend along the edges of the substrate 10 completely and may form a frame structure.

Further, one side of the heat transfer pattern 13 may be flush with the edge of the substrate 10 (or the display panel 1). The signal transmission terminals 15 may be set on the insulation layer 101. The signal transmission terminals 15 may include a first transmission layer 151 and a second transmission layer 152. A passivation layer 153 may be formed between the first transmission layer 151 and the second transmission layer 152. The passivation layer 153 may cover the heat transfer pattern 13.

A gate metal layer, a source/drain metal layer and a transparent conductive layer may be formed in the display region of the substrate 10. The heat transfer pattern 13 may include at least one metal layer. In a embodiment, the heat transfer pattern 13 may use a single layer structure configuration. Further, the heat transfer layer 13 may be formed as the same layer as the gate metal layer or the source/drain metal layer to simplify the fabrication process. In addition, the first transmission layer 151 of the signal transmission terminals 15 may be formed as the same layer as the gate metal layer or the source/drain metal layer, and the second transmission layer 152 may be formed as the same layer as the transparent conductive layer.

Figure 3:
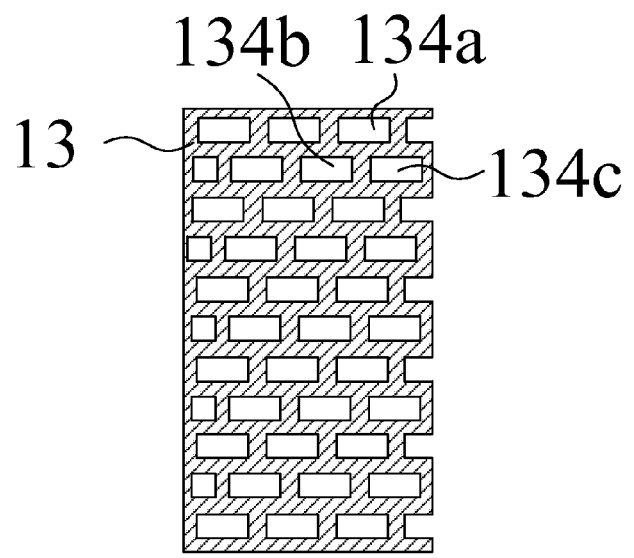
FIG. 3 illustrates an enlarged view of an exemplary heat transfer pattern at the B position in FIG. 1 consistent with disclosed embodiments.

FIG. 3 illustrates an enlarged view of an exemplary heat transfer pattern at the B position in FIG. 1 consistent with the disclosed embodiment.

As shown in FIG. 3, the heat transfer pattern 13 may include a plurality of hollow patterns staggered together. The hollow patterns may include polygons, circles or a combination of various shapes. In one embodiment, the hollow patterns are formed by rectangles. The hollow patterns may further include a first hollow pattern 134a, a second hollow pattern 134b and a third hollow pattern 134c arranged in parallel with the edge of the substrate and staggered together. That is, the three hollow patterns may extend along the edge of the substrate and may appear one after another.

The heat transfer pattern in the border region of the display panel may be used to dissipate the heat generated in a cutting process. However, when using the laser cutting process, the surface of the heat transfer pattern may reflect certain amount of laser and, thus, a stronger laser may be needed to cut the display panel. By setting a plurality of hollow patterns in the heat dissipation pattern, the path which laser cutting is directly on the heat transfer pattern may be reduced. Thus, the amount of laser reflected at the surface of the heat transfer pattern may be reduced and the cutting efficiency may be increased. High-efficiency cutting may be obtained and neat cutting edges may also be obtained. Thermal expansion and thermal deformation of the display panel resulted from the excess local heat may be reduced.

In certain other embodiments, the hollow patterns in the heat transfer pattern 13 may be arranged in various ways. For example, the hollow patterns may be configured in the heat transfer pattern 13 close to the edge of the substrate 10, while the hollow patterns may not be included in the heat transfer pattern 13 far from the edge of the substrate 10. That is, the hollow patterns are only placed in the cutting regions to improve the laser cutting process, while solid patterns are used in the rest of the heat transfer pattern to improve heat transfer and dissipation capacity. In this way, the coverage of the heat transfer pattern may be increased. Heat generated during the laser cutting process may be absorbed and dissipated more efficiently.

Thus, by placing heat transfer pattern in the border region surrounding the display panel, during the cutting process, the generated heat may be absorbed and dissipated by the heat transfer pattern. Thermal expansion of the component layer in the display panel may be reduced. As a result, damages to the peripheral components from the display panel's thermal expansion may be avoided, and the display panel production yield may be improved.

Figure 4:
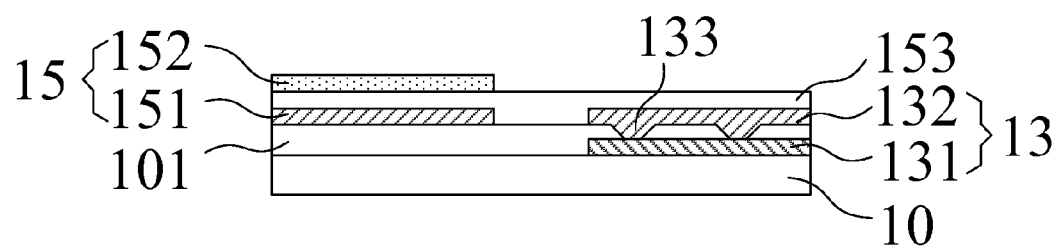
FIG. 4 illustrates the C-C' sectional view of another exemplary heat transfer pattern in FIG. 1 consistent with disclosed embodiments.

FIG. 4 illustrates the C-C' sectional view of another exemplary heat transfer pattern in FIG. 1 consistent with the disclosed embodiments.

As shown in FIG. 1 and FIG. 4, an insulation 101 may be formed on the substrate 10. A heat transfer pattern 13 may be formed in the border region 12 on the insulation layer 101. The heat transfer pattern 13 may extend along the edge of at least a portion of the substrate 10. In a embodiment, the heat transfer pattern 13 may extend along the edges of the substrate 10 completely and may form a frame structure.

Further, one side of the heat transfer pattern 13 may be flush with the edge of the substrate 10 (or the display panel 1). One or more signal transmission terminals 15 may be formed on the insulation layer 101. The signal transmission terminals 15 may include a first transmission layer 151 and a second transmission layer 152. A passivation layer 153 may be formed between the first transmission layer 151 and the second transmission layer 152. The passivation layer 153 may cover the heat transfer pattern 13.

A gate metal layer, a source/drain metal layer and a transparent conductive layer may be formed in the display region of the substrate 10. In a embodiment, the heat transfer pattern 13 may use a double-layer structure configuration, including a first heat transfer pattern layer 131 and a second heat transfer pattern layer 132.

Further, the first heat transfer pattern layer 131 may be formed as the same layer as the gate metal layer, and the second heat transfer pattern layer 132 may be formed as the same layer as the source/drain metal layer. The insulation layer 101 may include at least one via 133. The first heat transfer pattern layer 131 and the second heat transfer pattern layer 132 may be electrically connected through the via 133. That is, the heat transfer pattern 13 may include overlapped and electrically interconnected first heat transfer pattern layer 131 and second heat transfer pattern layer 132.

Because the heat transfer pattern 13 may be formed as the same layer as the gate metal layer or the source/drain metal layer, the fabrication process may be simplified. Further, the first transmission layer 151 of the signal transmission terminals 15 may be formed as the same layer as the gate metal layer or the source/drain metal layer, and the second transmission layer 152 of the signal transmission terminals 15 may be formed as the same layer as the transparent conductive layer.

By setting the multi-layered heat transfer pattern in the border region of the display panel, during the cutting process, the generated heat may be dissipated significantly fast. Further, by connecting the multiple layers of the heat transfer pattern together, heat may be transferred and dissipated in the multi-layered structure. Thus, the generated heat may be efficiently absorbed and dissipated. The display panel component layer thermal expansion resulted from the excess heat absorption may be reduced. Damages to the peripheral components around the display panel due to the thermal expansion may be avoided, and the display panel production yield may be improved.

Figure 5:
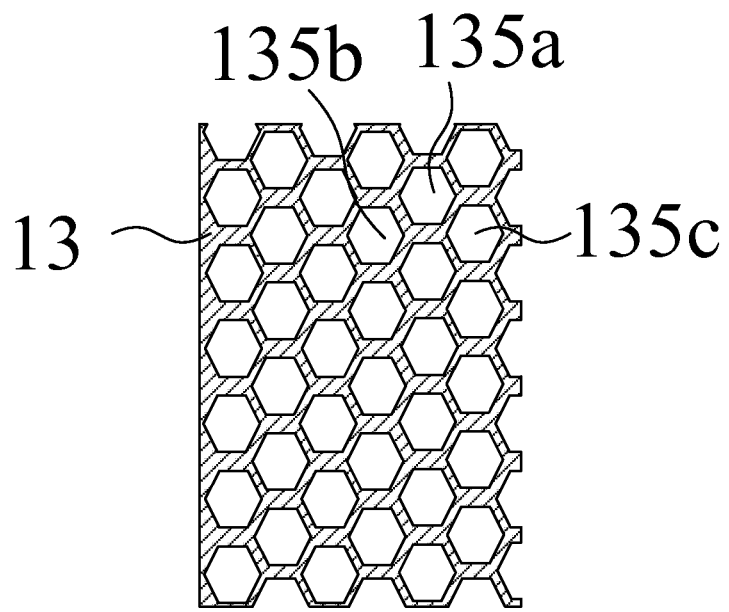
FIGS. 5-9 illustrate enlarged views of various exemplary heat dissipation patterns at the B position in FIG. 1 consistent with disclosed embodiments.

FIG. 5 illustrates an enlarged view of another exemplary heat transfer pattern at the B position in FIG. 1 consistent with the disclosed embodiments.

As shown in FIG. 5, the heat transfer pattern 13 may include a plurality of hollow patterns staggered together. The hollow patterns in the heat transfer pattern 13 may be arranged in various ways. For example, the hollow patterns may be configured in the heat transfer pattern 13 close to the edge of the substrate 10, while the hollow patterns may not be included in the heat transfer pattern 13 far from the edge of the substrate 10. That is, the hollow patterns are only placed in the cutting regions to improve the laser cutting process, while solid patterns are used in the rest of the heat transfer pattern to improve heat transfer and dissipation capacity. In this way, the coverage of the heat transfer pattern may be increased, and heat generated during the laser cutting process may be absorbed and dissipated efficiently.

In a embodiment, the hollow patterns are formed by hexagons, including a first hollow region 135a, a second hollow region 135b and a third hollow region 135c arranged in parallel to the edge of the substrate and staggered together. That is, the hollow patterns may extend along the edge direction of the substrate and may be arranged one after another.

The heat transfer pattern in the border region of the display panel may be used to dissipate the heat generated in a cutting process. However, when using the laser cutting process, the surface of the heat transfer pattern may reflect certain amount of laser. Thus, more powerful laser may be needed to cut the display panel. By setting a plurality of hollow patterns in the heat dissipation pattern, the path which laser cutting is directly on the heat transfer pattern may be reduced. Thus, the amount of laser reflected at the surface of the heat transfer pattern may be reduced and the cutting efficiency may be increased. High-efficiency cutting may be obtained and neat cutting edges may also be obtained. Thermal expansion and thermal deformation of the display panel resulted from the excess local heat may be reduced.

Figure 6:
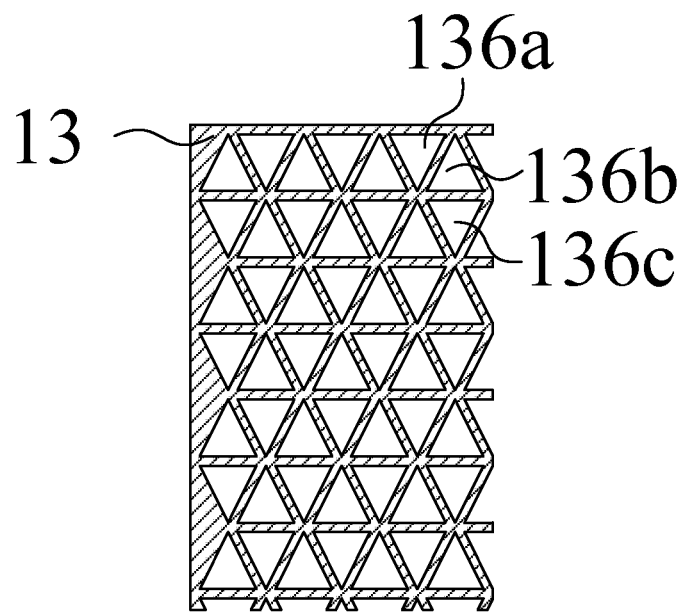

FIG. 6 illustrates an enlarged view of another exemplary heat transfer pattern at the B position in FIG. 1 consistent with the disclosed embodiments.

As shown in FIG. 6, the heat transfer pattern 13 may include a plurality of hollow patterns staggered together. The hollow patterns in the heat transfer pattern 13 may be arranged in various ways. For example, the hollow patterns may be configured in the heat transfer pattern 13 close to the edge of the substrate 10, while the hollow patterns may not be included in the heat transfer pattern 13 far from the edge of the substrate 10. That is, the hollow patterns are only placed in the cutting regions to improve the laser cutting process, while solid patterns are used in the rest of the heat transfer pattern to improve heat transfer and dissipation capacity. In this way, the coverage of the heat transfer pattern may be increased. Thus, heat generated during the laser cutting process may be absorbed and dissipated efficiently.

In a embodiment, the hollow patterns are formed by triangles, including a first hollow region 136a, a second hollow region 136b and a third hollow region 136c. The first hollow triangle 136a and the second hollow triangle 136b may be arranged in opposite posture (in reverse positions alternatingly) along the row direction. The second hollow triangle 136b and the third hollow triangle 136c may be arranged in opposite posture (in reverse positions alternatingly) along the column direction. That is, along the extension direction of the edges of the substrate, the three hollow patterns may be arranged periodically or one after another.

The heat transfer pattern in the border region of the display panel may be used to dissipate the heat generated during the cutting process. However, when using the laser cutting process, the surface of the heat transfer pattern may reflect certain amount of laser. Thus, stronger laser may be needed to cut the display panel. By setting a plurality of hollow patterns in the heat dissipation pattern, the path which laser cutting is directly on the heat transfer pattern may be reduced. Thus, the amount of laser reflected at the surface of the heat transfer pattern may be reduced and the cutting efficiency may be increased. High efficiency cutting may be obtained and neat cutting edges may also be obtained. Thermal expansion and thermal deformation of the display panel resulted from the excess local heat may be reduced.

Figure 7:
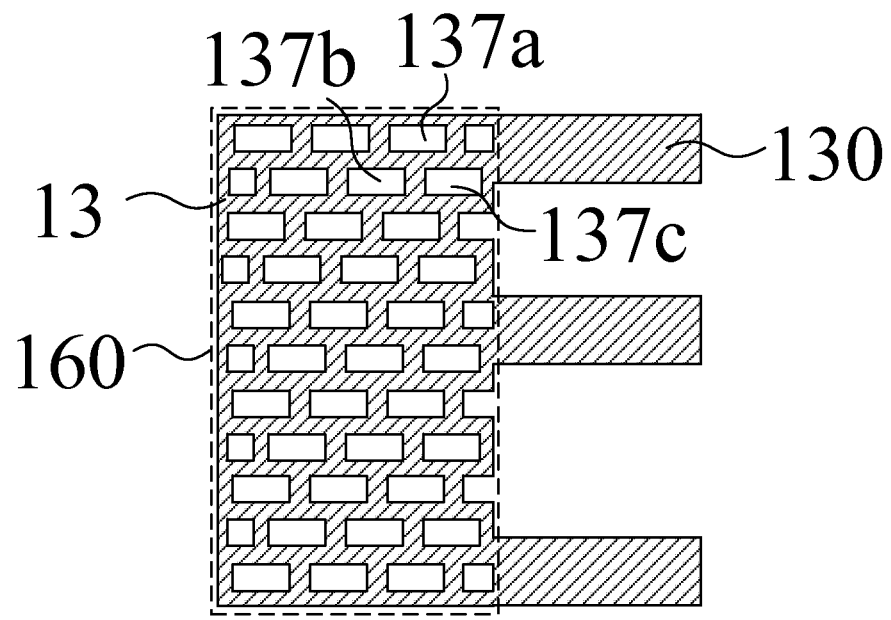

FIG. 7 illustrates an enlarged view of another exemplary heat transfer pattern at the B position in FIG. 1 consistent with the disclosed embodiments.

As shown in FIG. 7, the heat transfer pattern 13 may include a frame structure 160 and at least one sub-lead structure 130. The sub-lead structure 130 may extend to the edge of the display panel 1 and may be flush with the edge of the display panel 1. Prior cutting to form the display panel 1, the sub-lead structures 130 on the adjacent display panels 1 may be connected together. Thus, heat generated during the cutting process may not only be absorbed and dissipated by one display panel, but may also be transferred between different display panels. Thus, the risk of damaging the peripheral components due to the display panel's local thermal expansion may be further reduced.

The frame structure 160 of the heat transfer pattern 13 may include a plurality of hollow patterns staggered together. The hollow patterns in the heat transfer pattern 13 may be arranged in various ways. For example, the hollow patterns may be configured in the heat transfer pattern 13 close to the edge of the substrate 10, while the hollow patterns may not be included in the heat transfer pattern 13 far from the edge of the substrate 10. In this way, the coverage of the heat transfer pattern may be increased. Thus, heat generated during the laser cutting process may be absorbed and dissipated efficiently.

In a embodiment, the hollow patterns may be rectangles, including a first hollow region 137a, a second hollow region 137b and a third hollow region 137c. The three hollow patterns may be staggered together alone the edge direction parallel to the substrate. That is, along the extension direction along the edges of the substrate, the three hollow patterns may be arranged periodically.

The heat transfer pattern in the border region of the display panel may be used to dissipate the heat generated during the cutting process. However, when using the laser cutting process, the surface of the heat transfer pattern may reflect certain amount of laser. Thus, stronger laser may be needed to cut the display panel. By setting a plurality of the hollow patterns and/or sub-lead structures in the heat transfer pattern, the path which laser cutting is directly on the heat transfer pattern may be reduced. Thus, the amount of laser reflected at the surface of the heat transfer pattern may be reduced, and the cutting efficiency may be increased. As a result, high-efficiency cutting process may be obtained, neat cutting edges may be created, and the display panel's thermal expansion and thermal deformation resulted from the excess local heat may be reduced.

Figure 8:
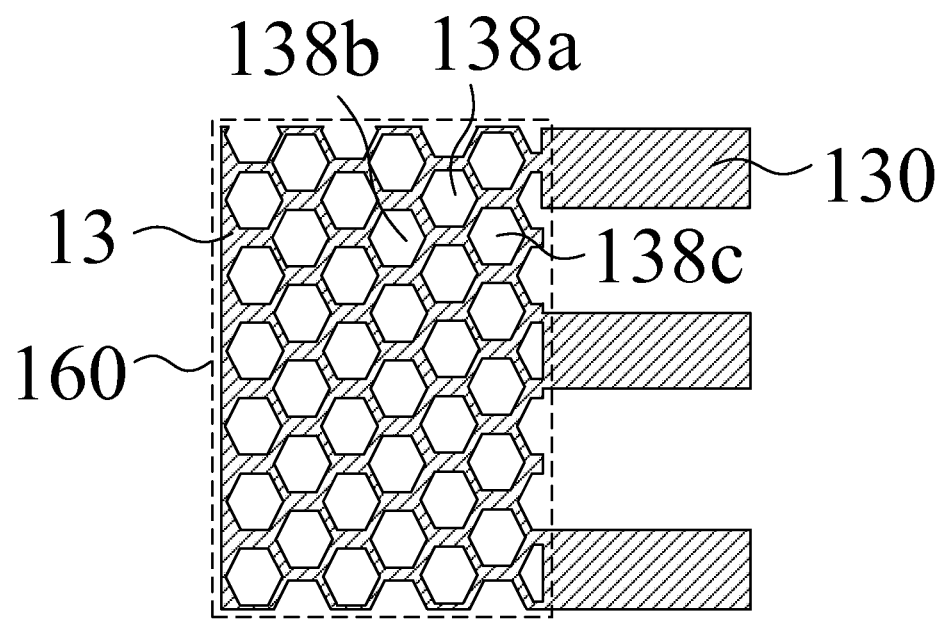

FIG. 8 illustrates an enlarged view of another exemplary heat transfer pattern at the B position in FIG. 1 consistent with the disclosed embodiment.

As shown in FIG. 8, the heat transfer pattern 13 may include a frame structure 160 and at least one sub-lead structure 130. The sub-lead structure may extend to the edge of the display panel 1 and may be flush with the edge of the display panel 1. Prior cutting to form the display panel 1, the sub-lead structures 130 on the adjacent display panels 1 may be connected together. Thus, heat generated during the cutting process may not only be absorbed and dissipated by one display panel, but may also be transferred between different display panels. Thus, the risk of damaging the peripheral components due to the display panel's local thermal expansion may be further reduced.

The frame structure 160 of the heat transfer pattern 13 may include a plurality of hollow patterns staggered together. The hollow patterns in the heat transfer pattern 13 may be arranged in various ways. For example, the hollow patterns may be configured in the heat transfer pattern 13 close to the edge of the substrate 10, while the hollow patterns may not be included in the heat transfer pattern 13 far from the edge of the substrate 10. In this way, the coverage of the heat transfer pattern may be increased. Thus, heat generated during the laser cutting process may be absorbed and dissipated efficiently.

In one embodiment, the hollow patterns may be hexagons, including a first hollow region 138a, a second hollow region 138b and a third hollow region 138c. The three hollow patterns may be staggered together alone the edge direction parallel to the substrate. That is, along the extension direction of the edges of the substrate, the three hollow patterns may be arranged periodically.

The heat transfer pattern in the border region of the display panel may be used to dissipate the heat generated during the cutting process. However, when using the laser cutting process, the surface of the heat transfer pattern may reflect certain amount of laser. Thus, stronger laser may be needed to cut the display panel. By setting a plurality of the hollow patterns and/or sub-lead structures in the heat transfer pattern, the path which laser cutting is directly on the heat transfer pattern may be reduced. Thus, the amount of laser reflected at the surface of the heat transfer pattern may be reduced, and the cutting efficiency may be increased. As a result, high-efficiency cutting process may be obtained, neat cutting edges may be obtained, and the display panel's thermal expansion and thermal deformation result from the excess local heat may be reduced.

Figure 9:
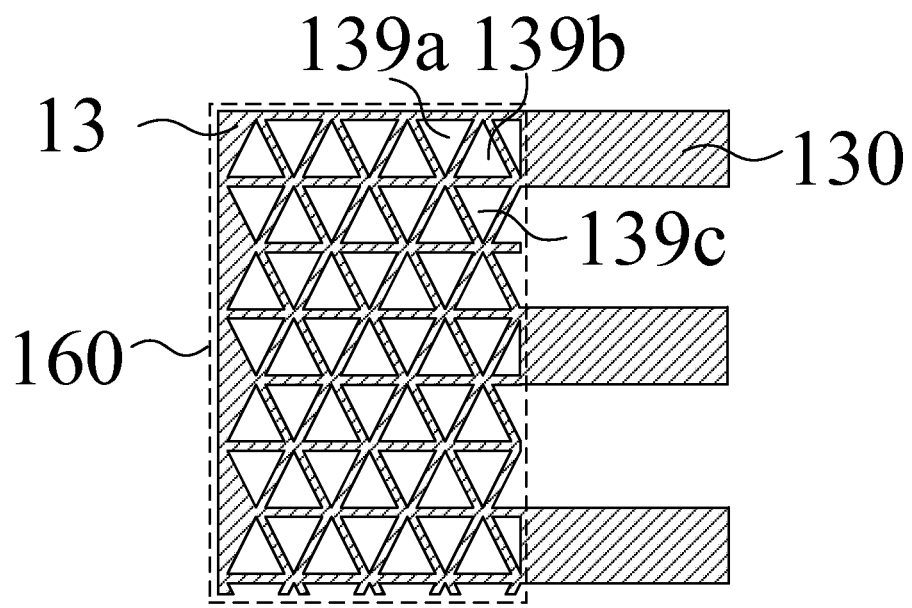

FIG. 9 illustrates an enlarged view of another exemplary heat transfer pattern at the B position in FIG. 1 consistent with the disclosed embodiment.

As shown in FIG. 9, the heat transfer pattern 13 may include a frame structure 160 and at least one sub-lead structure 130. The sub-lead structure may extend to the edge of the display panel 1 and may be flush with the edge of the display panel 1. Prior cutting to form the display panel 1, the sub-lead structures 130 on the adjacent display panels 1 may be connected together. Thus, heat generated during the cutting process may not only be absorbed and dissipated by one display panel, but also may be transferred between different display panels. Thus, the risk of damaging the peripheral components because of the display panel's local thermal expansion may be further reduced.

The frame structure 160 of the heat transfer pattern 13 may include a plurality of hollow patterns staggered together. The hollow patterns in the heat transfer pattern 13 may be arranged in various ways. For example, the hollow patterns may be configured in the heat transfer pattern 13 close to the edge of the substrate 10, while the hollow patterns may not be included in the heat transfer pattern 13 far from the edge of the substrate 10. In this way, the coverage of the heat transfer pattern may be increased. Thus, heat generated during the laser cutting process may be absorbed and dissipated efficiently.

In a embodiment, the hollow patterns may be triangles, including a first hollow region 139a, a second hollow region 139b and a third hollow region 139c. The first hollow region 136a and the second hollow region 136b may be arranged in opposite posture (in reverse positions alternatingly) along the row direction. The second hollow region 136b and the third hollow region 136c may be arranged in opposite posture (in reverse positions alternatingly) along the column direction. That is, along the extension direction along the edges of the substrate, the three hollow patterns may be arranged periodically or one after another.

The heat transfer pattern in the border region of the display panel may be used to dissipate the heat generated during the cutting process. However, when using the laser cutting process, the surface of the heat transfer pattern may reflect certain amount of laser. Thus, stronger laser may be needed to cut the display panel. By setting a plurality of the hollow patterns and/or sub-lead structures in the heat transfer pattern, the path which laser cutting is directly on the heat transfer pattern may be reduced. Thus, the amount of laser reflected at the surface of the heat transfer pattern may be reduced, and the cutting efficiency may be increased. As a result, high-efficiency cutting process may be obtained, neat cutting edges may be created, and the display panel's thermal expansion and thermal deformation result from the excess local heat may be reduced.

Figure 10:
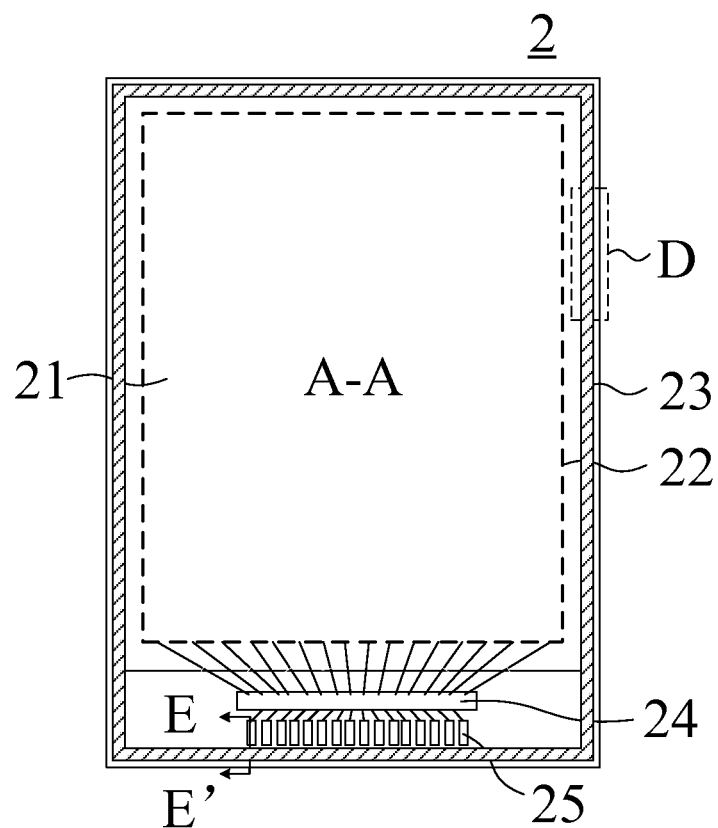
FIG. 10 illustrates another exemplary display panel consistent with disclosed embodiments.
Figure 11:
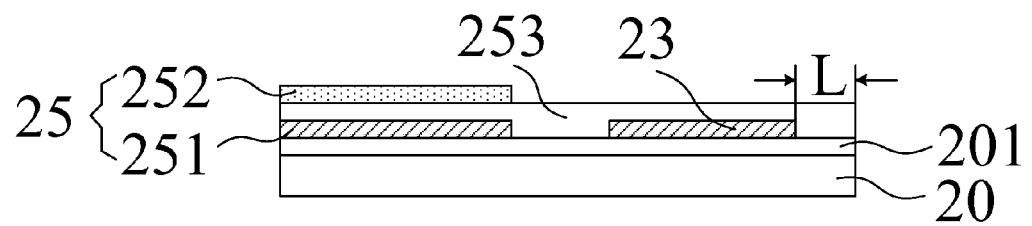
FIG. 11 illustrates an E-E' sectional view of an exemplary heat transfer pattern in FIG. 10 consistent with disclosed embodiments.

FIG. 10 illustrates a schematic of another exemplary display panel consistent with the disclosed embodiments. FIG. 11 illustrates the E-E' sectional view of the exemplary heat transfer pattern in FIG. 10 consistent with the disclosed embodiment.

As shown in FIG. 10, the display panel 2 may include a substrate. The substrate may be a flexible substrate. The substrate may further include an A-A display region 21 and a border region 22 surrounding the A-A display region 21. A heat transfer pattern 23 may be formed in the border region 22 of the substrate. Further, one or more driving chips 24 and signal transmission terminals 25 may be set in the border region 22 of the display panel 2. The signal transmission terminals 25 may be located on the inner side of the heat transfer pattern 23 and at the far side of the edge of the substrate. The driving chips 24 may be electrically connected to the signal transmission terminals 25, and may also be electrically connected to the pixel units in the display region 21 to supply display signals.

As shown in FIG. 11, an insulation layer 201 may be formed on the substrate 20. The heat transfer pattern 23 may be formed in the border region 22 on the insulation layer 201. The heat transfer pattern 23 may extend along at least a portion of the edge of the substrate 20.

In a embodiment, the heat transfer pattern 23 may extend along the edges of the substrate 20 completely and may form a frame structure. Further, one side of the heat transfer pattern 23 may have a pre-defined distance L to the edge of the substrate 20 (or the display panel 2). The predefined distance L may be larger than zero.

Thus, with the predefined distance L, between adjacent display panels to be cut, a gap may exist (with a width of L or 2L). During the laser cutting process, the laser may travel in the gap instead of cutting through the heat transfer pattern of the substrate. Thus, it may be unnecessary to increase the power of the laser to achieve the high efficient cutting. Neat cutting edges may be obtained, and the thermal expansion and thermal deformation of the display panel result from the excess local heat may be reduced.

Further, the signal transmission terminals 25 may be formed on the insulation layer 201. The signal transmission terminals 25 may include a first transmission layer 251 and a second transmission layer 252. A passivation layer 253 may be formed between the first transmission layer 251 and the second transmission layer 252. The passivation layer 253 may cover the heat transfer pattern 23.

In addition, a gate metal layer, a source/drain metal layer and a transparent conductive layer may be formed in the display region of the substrate 20. The heat transfer pattern 23 may include at least one metal layer. In a embodiment, the heat dissipation layer 23 may use a single-layer structure configuration. The heat transfer layer 23 may be formed as the same layer as the gate metal layer or the source/drain metal layer to simplify the fabrication process.

Moreover, the first transmission layer 251 of the signal transmission terminals 25 may be formed as the same layer as the gate metal layer or the source/drain metal layer, and the second transmission layer 152 may be formed as same layer as the transparent conductive layer. The heat transfer pattern 23 may use various heat transfer patterns such as shown in FIG. 3, FIG. 5 and/or FIG. 7.

Figure 12:
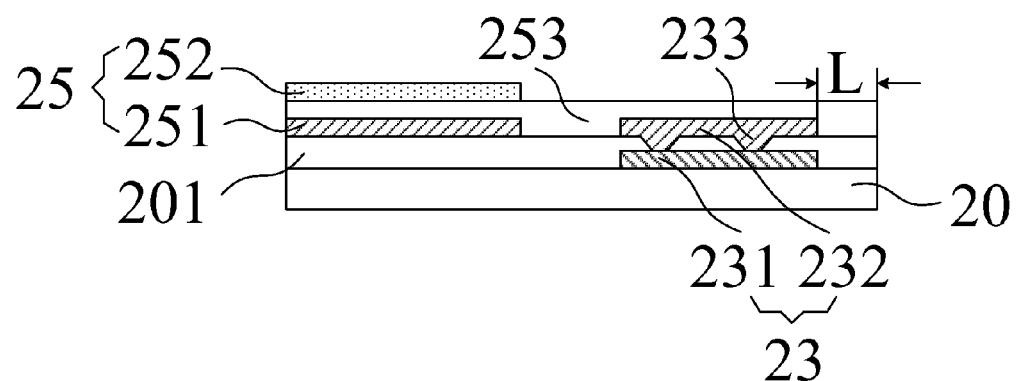
FIG. 12 illustrates the E-E' sectional view of another exemplary heat transfer pattern in FIG. 10 consistent with disclosed embodiments.

FIG. 12 illustrates another E-E' sectional view of the exemplary heat transfer pattern in FIG. 10 consistent with the disclosed embodiment. As shown in FIG. 10 and FIG. 12, an insulation layer 201 may be formed on the substrate 20. The heat transfer pattern 23 may be formed in the border region 12 on the insulation layer 201. The heat transfer pattern 23 may extend along at least a portion of the edges of the substrate 20.

In a embodiment, the heat transfer pattern 23 may extend along the edges of the substrate 20 completely and may form a frame structure. Further, one side of the heat transfer pattern 23 may have a pre-defined distance L to the edge of the substrate 20 (or the display panel 2). The predefined distance L may be larger than zero.

Thus, between adjacent display panels to be cut, a gap may exist (with a width of L or 2L). During the laser cutting process, the laser may travel in the gap instead of cutting through the heat transfer pattern of the substrate. Thus, it may be unnecessary to increase the power of the laser to achieve the high-efficient cutting. Neat cutting edges may be obtained, the thermal expansion and thermal deformation of the display panel result from the excess local heat may be reduced. Optionally, one or more sub-lead structure may be placed cross the gap.

Further, the signal transmission terminals 25 may be formed on the insulation layer 201. The signal transmission terminals 25 may include a first transmission layer 251 and a second transmission layer 252. A passivation layer 253 may be formed between the first transmission layer 251 and the second transmission layer 252. The passivation layer 253 may cover the heat transfer pattern 23.

In addition, a gate metal layer, a source/drain metal layer and a transparent conductive layer may be formed in the display region of the substrate 20. In a embodiment, the heat transfer pattern 23 may use a double-layer structure configuration, including a first heat transfer pattern layer 231 and a second heat transfer pattern layer 232 stacked together.

Further, the first heat transfer pattern layer 231 may be formed as the same layer as the gate metal layer, and the second heat transfer pattern layer 232 may be formed as the same layer as the source/drain metal layer. The insulation layer 201 may include at least one via 233. The first heat transfer pattern layer 231 and the second heat transfer pattern layer 232 may be electrically connected through the via 233. That is, the heat transfer pattern 23 may include multi-layered and electrically connected first heat transfer pattern layer 231 and second heat transfer pattern layer 232, with one or more layers formed as same layers of the above illustrated gate metal layer and source/drain metal layer.

The gate metal layer may be electrically connected to the source/drain metal layer through the via. The heat transfer pattern 23 may be formed as the same layer as the gate metal layer or the source/drain layer. Thus, the fabrication process may be simplified. Further, the first transmission layer 251 of the signal transmission terminals 25 may be formed as the same layer as the gate metal layer or the source/drain metal layer, and the second transmission layer 252 of the signal transmission terminals 25 may be formed as the same layer as the transparent conductive layer.

By setting the multi-layered heat transfer pattern in the border region of the display panel, during the cutting process, the generated heat may be dissipated efficiently. Further, by electrically connecting the multiple layers of heat transfer patterns together, heat may be transferred and dissipated in the multi-layered structure. The generated heat may be significantly well absorbed and dissipated. The display panel component layer's thermal expansion due to excess heat absorption may be reduced. Damages to the peripheral components around the display panel caused by the thermal expansion may be avoided, and the display panel production yield may be improved.

According to disclosed embodiments, a display device may also be provided. The display device may include one or more above-illustrated display panels. The display panels may be the Organic Light Emitting Diode (OLED) display panels, the electrophoretic display panels, and/or the liquid crystal display panels, etc. The display panels may be rigid display panels, as well as flexible display panels.

Further, referring to FIG. 13, heat transfer patterns in multiple display panels of the mother substrate are illustrated in more details. As shown in FIG. 13, the mother substrate 3 may include a display panel region 35 and a peripheral region 36 surrounding the display panel region 35.

A plurality of display panels 30 may be formed in the display panel region 35. A display panel 30 may include a substrate (not shown in FIG. 13). The substrate may be a flexible substrate. The substrate may further include an A-A display region 31 and a border region 32 surrounding the A-A display region 31. A heat transfer pattern 33 may be formed in the border region 32 of the substrate. The heat transfer pattern 33 may be used to dissipate the heat generated during cutting the mother substrate 3.

Moreover, the heat transfer patterns 33 located on the adjacent display panels 30 may be connected together. The connected heat transfer patterns 33 may form a first heat transfer pattern 331 and a second heat transfer pattern 332. The first heat transfer pattern 331 may extend along a first direction, and the second heat transfer pattern 332 may extend along a second direction. The second direction may be the substrate 30's edge direction. The first direction and the second direction may be approximately perpendicular to each other. The first heat transfer pattern 331 and the second heat transfer pattern 332 on the mother substrate 3 may cross each other and may form a grid structure.

In addition, a gate metal layer, a source/drain metal layer and a transparent conductive layer may be formed on the substrate 30. In a embodiment, the heat transfer pattern 33 may include at least one metal layer. When the heat transfer pattern 33 uses a single layer structure, the heat transfer pattern 33 may be formed as the same layer as the gate metal layer or the source/drain metal layer. In other embodiments, the heat transfer pattern 33 may include a multi-layer structure. For example, when the heat transfer pattern 33 uses a stacked double-layer structure, the heat transfer pattern 33 may include two stacked and electrically connected the heat transfer pattern layers, with one or more layers formed as same layers of the above illustrated gate metal layer and source/drain metal layer.

As described previously, when forming the individual display panel 30, laser may be used to cut along the cutting path 34 to cut the mother substrate 3. Large amount of heat may be generated at the area close to the cutting path 34. The first heat transfer pattern 331 and the second heat transfer pattern 332 may absorb the heat and transfer the heat to the entire mother substrate 3. Thus, the individual display panel 30's thermal expansion at the area close to the cutting path 34 may be avoided, and the risk of damaging the peripheral components around the display panel 30 may be reduced.

Figure 15A:
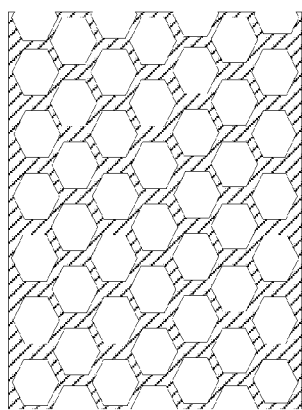
FIGS. 15A-15C illustrate exemplary heat transfer patterns on a mother substrate consistent with disclosed embodiments.
Figure 15B:
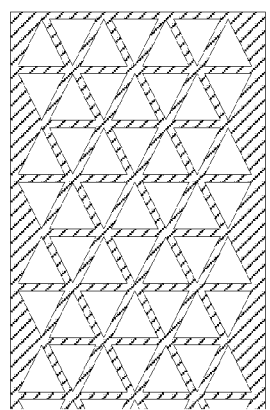
Figure 15C:
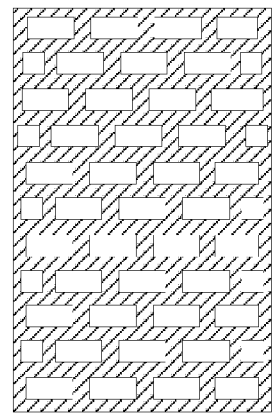
Figure 16:
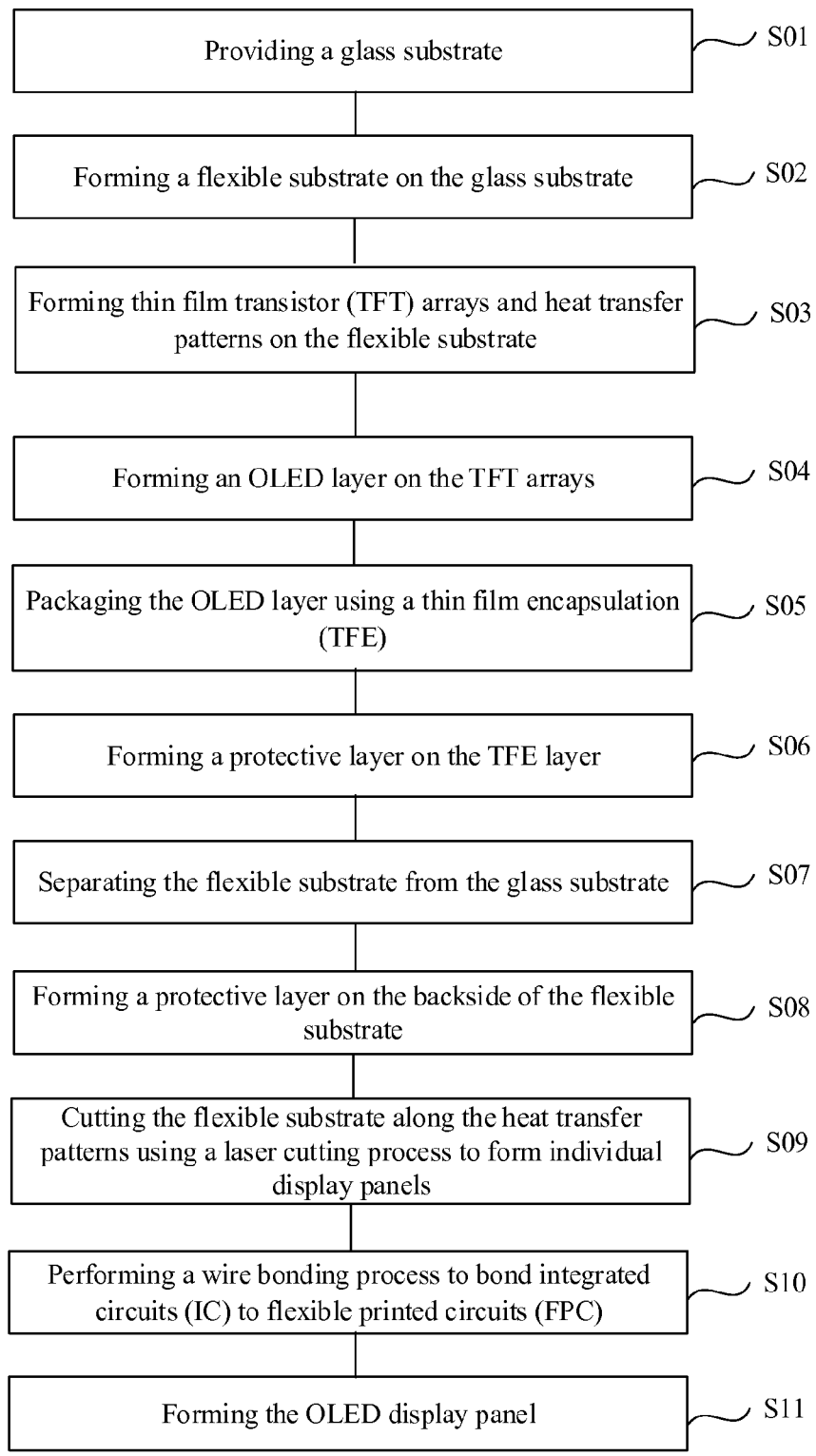
FIG. 16 illustrates a flow chart of an exemplary display panel fabrication process consistent with disclosed embodiments.

The heat transfer pattern 33 may extend along at least a portion of the edges of the display panel. The heat transfer pattern 33 may use various heat transfer patterns or structures as illustrated in the above exemplary embodiments. For example, FIG. 15A illustrates a heat transfer pattern formed between the display panels before being cut by the laser, similar to the heat transfer pattern in FIG. 5. FIG. 15B illustrates a heat transfer pattern formed between the display panels before being cut by the laser, similar to the heat transfer pattern in FIG. 6. FIG. 15C illustrates a heat transfer pattern formed between the display panels before being cut by the laser, similar to the heat transfer pattern in FIG. 3.

Figure 14:
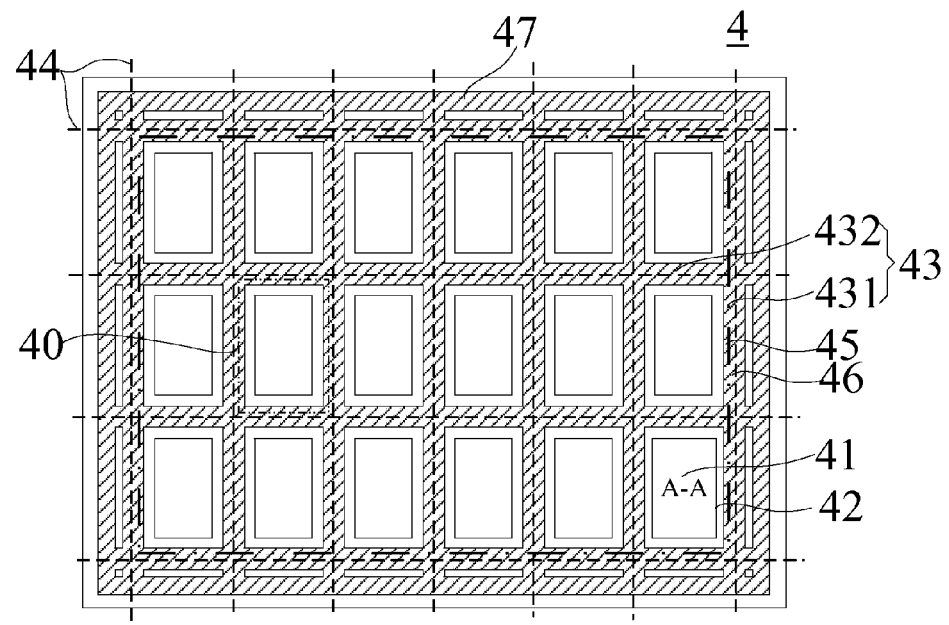
FIG. 14 illustrates a schematic of another exemplary mother substrate consistent with disclosed embodiments.

FIG. 14 illustrates a schematic of another exemplary mother substrate 4 consistent with the disclosed embodiments. As shown in FIG. 14, the mother substrate 4 may include a display panel region 45 and a peripheral region 46 surrounding the display panel region 45.

A plurality of display panels 40 may be set in the display panel region 45. A display panel 40 may include a substrate (not shown in FIG. 14). The substrate may be a flexible substrate. The substrate may further include an A-A display region 41 and a border region 42 surrounding the A-A display region 41. A heat transfer pattern 43 may be formed in the border region 42 of the substrate. A heat transfer bus 47 may be formed in the peripheral region 46 of the mother substrate 4.

The heat transfer bus 47 may surround the display panel region 45 and may be connected to the heat transfer pattern 43. The heat transfer pattern 43 and the heat transfer bus 47 may be used to dissipate the heat generated during cutting the mother substrate 4.

Moreover, the heat transfer patterns 43 on the adjacent display panels 40 may be connected together. The connected heat transfer patterns 43 may form a first heat transfer pattern 431 and a second heat transfer pattern 432. The first heat transfer pattern 431 may extend along a first direction, and the second heat transfer pattern 432 may extend along a second direction. The second direction may be along the substrate 40's edge direction. The first direction and the second direction may be approximately perpendicular to each other. The first heat transfer pattern 431 and the second heat transfer pattern 432 on the mother substrate 4 may cross each other and may form a grid structure.

In addition, a gate metal layer, a source/drain metal layer and a transparent conductive layer may be formed on the substrate 40. The heat transfer bus 47 may include at least one metal layer. When the heat transfer bus 47 uses a single layer structure, the heat transfer bus 47 may be formed as the same layer as the gate metal layer or the source/drain metal layer. When the heat transfer bus 47 uses a double layer structure, the heat transfer bus 47 may include multiple and electrically connected layers, with one or more layers formed as same layers of the above illustrated gate metal layer and source/drain metal layer.

The heat transfer bus 47 may extend along the edges of the display panel mother substrate 4 and may form a frame structure. The two ends of the first heat transfer pattern 431 may be connected to the heat transfer bus 47, and the two ends of the second heat transfer pattern 432 may also be connected to the heat transfer bus 47.

Thus, comparing with the mother substrate 3 shown in FIG. 13, the mother substrate 4 include the heat transfer bus 47 in the peripheral region 46 and may be connected to the first heat transfer pattern 431 and the second heat transfer pattern 432 passing across the plurality of display panels 40. When forming the display panel 40, the laser may cut along the cutting path 44 to cut the mother substrate 4.

During the cutting process, large amount of heat may be generated at the area close to the cutting path 44. The first heat transfer pattern 431 and the second heat transfer pattern 432 may absorb the heat and may transfer the heat to the heat transfer bus 47 located in the peripheral region 46 of the mother substrate 4. The heat may be dissipated not only in the entire display panel region 45, but also in the peripheral region 46 through the heat transfer bus 47. Thus, the thermal expansion of the display panels 40 caused by the excess heat absorption at the cutting path area may be avoided. The risk of damaging the peripheral components around the display panel 40 may be reduced, and the display panel production yield may be improved.

Embodiments consistent with the current disclosure provide a display panel, a display device and a mother substrate. By using the disclosed structures and methods, the heat transfer patterns may be formed along the edges of individual display panels and/or along the edges of the flexible mother substrate. Thus, during the laser cutting process, the cutting path may be set along the heat transfer patterns. In addition, the heat transfer patterns may use various configurations. For example, the heat transfer patterns may include hollow structures. By arranging the hollow structures in the heat transfer patterns, laser reflection at the surface of the heat transfer patterns may be reduced. Thus, high-efficiency laser cutting may be achieved. Moreover, gaps may be set between the heat transfer patterns located on adjacent display panels, and the laser may cut along the gaps. The laser reflection may be further reduced while the heat transfer capability of heat transfer patterns may be maintained at the same level.

Other applications, advantages, alternations, modifications, or equivalents to the disclosed embodiments are obvious to those skilled in the art. It is intended that the specification and embodiments be considered as exemplary only, with a true scope and spirit of the invention being indicated by the claims.

What is claimed is:
1. A display panel, comprising:
  a substrate including a display region and a border region surrounding the display region; and
  a heat transfer pattern surrounding the display region formed in the border region of the substrate and configured to transfer and dissipate heat generated when cutting the display panel from a mother substrate, wherein the heat transfer pattern includes at least one metal layer, and cutting paths for cutting the display panel from the mother substrate are directly on the heat transfer pattern.

2. The display panel according to claim 1, wherein:
  the heat transfer pattern includes a plurality of overlapped and staggered hollow patterns in a shape of a polygon including a rectangle, a triangle, and a hexagon.

3. The display panel according to claim 1, wherein:
  the heat transfer pattern is a frame structure extending along edges of the substrate; and
  the heat transfer pattern includes at least one sub-lead structure connected to the frame structure and extending to an edge of the display panel.

4. The display panel according to claim 1, further including:
  a plurality of signal transmission terminals disposed in the border region and on an inner side of the heat transfer pattern, away from an edge of the substrate.

5. The display panel according to claim 1, wherein:
  the heat transfer pattern is located at a pre-defined distance from an edge of the substrate.

6. The display panel according to claim 1, wherein:
one side of the heat transfer pattern is flush with an edge of the substrate.

7. The display panel according to claim 1, further including:
a gate metal layer and a source/drain metal layer formed on the substrate,
wherein the heat transfer pattern is formed as the same layer as the gate metal layer or the source/drain metal layer.

8. The display panel according to claim 1, further including:
a gate metal layer and a source/drain metal layer formed on the substrate,
wherein the heat transfer pattern includes multiple metal layers, and at least one of the multiple metal layers is formed as the same layer as the gate metal layer or the source/drain metal layer.

9. The display panel according to claim 8, wherein:
an insulation layer is formed between two metal layers of the heat transfer pattern;
one or more vias are formed in the insulation layer; and
the two metal layers of the heat transfer pattern are electrically connected by the vias.

10. A display device, comprising a display panel according to claim 1.

11. A mother substrate of a plurality of display panels, comprising:
a display panel region containing the plurality of display panels;
a peripheral region surrounding the display panel region; and
a plurality of heat transfer patterns formed in the display panel region according to the plurality of display panels,
wherein each of the plurality of display panels includes a substrate containing a display region and a border region surrounding the display region; the border region is disposed with a heat transfer pattern surrounding the display region and configured to transfer and dissipate heat generated when cutting the display panel from the mother substrate; and cutting paths for cutting the display panel from the mother substrate are directly on the heat transfer pattern.

12. The mother substrate according to claim 11, wherein:
the heat transfer pattern extends along at least a portion of edges of the display panels.

13. The mother substrate according to claim 11, further including:
a heat transfer bus formed along the peripheral region surrounding the display panel region of the mother substrate and connected with the heat transfer pattern of each of the plurality of display panels.

14. The mother substrate according to claim 12, wherein:
the heat transfer pattern of each of the plurality of display panels includes overlapped and staggered hollow patterns in a shape of a polygon including a rectangle, a triangle, and a hexagon.

* * * * *